United States Patent
Mei et al.

(10) Patent No.: US 6,529,262 B1
(45) Date of Patent: Mar. 4, 2003

(54) SYSTEM AND METHOD FOR PERFORMING LITHOGRAPHY ON A SUBSTRATE

(75) Inventors: Wenhui Mei, Plano, TX (US); Takashi Kanatake, Dallas, TX (US)

(73) Assignee: Ball Semiconductor, Inc., Allen, TX (US)

( * ) Notice: Subject to any disclaimer, the term of this patent is extended or adjusted under 35 U.S.C. 154(b) by 0 days.

(21) Appl. No.: 09/547,743

(22) Filed: Apr. 12, 2000

Related U.S. Application Data

(60) Provisional application No. 60/129,315, filed on Apr. 14, 1999.

(51) Int. Cl.[7] .................. G03B 27/58; G03B 27/42; G01B 11/00; G01N 21/86; G03F 9/00
(52) U.S. Cl. ............... 355/47; 355/53; 355/55; 355/67; 356/399; 356/400; 250/548; 430/5; 430/22; 430/30
(58) Field of Search ............... 355/47, 53, 55, 355/67; 356/399, 400; 250/548; 430/5, 22, 30

(56) References Cited

U.S. PATENT DOCUMENTS

| | | | |
|---|---|---|---|
| 3,534,467 A | 10/1970 | Sachs et al. | 29/583 |
| 4,126,812 A | 11/1978 | Wakefield | 313/500 |
| 4,744,047 A | 5/1988 | Okamoto et al. | 364/900 |
| 4,879,466 A | 11/1989 | Kitaguchi et al. | 250/370.14 |
| 5,049,901 A | 9/1991 | Gelbart | 346/108 |
| 5,079,544 A | 1/1992 | DeMond et al. | 340/701 |
| 5,082,755 A | 1/1992 | Liu | 430/5 |
| 5,106,455 A | 4/1992 | Jacobsen et al. | 156/659.1 |
| 5,109,290 A | 4/1992 | Imai | 359/54 |
| 5,121,983 A | 6/1992 | Lee | 353/8 |
| 5,131,976 A | 7/1992 | Hoko | 156/630 |

(List continued on next page.)

FOREIGN PATENT DOCUMENTS

| | | | |
|---|---|---|---|
| EP | 0552953 | 7/1993 | ............. G03F/7/20 |
| WO | 9110170 | 7/1991 | |

OTHER PUBLICATIONS

"New Multi–EB Direct Write Concept for Maskless High Throughput", Canon SubMicron Focus, vol. 5, Summer 2000.

Singh–Gasson, Sangeet et al., Maskless Fabrication of Light–Directed Oligonucleotide Microarrays Using a Digital Micromirror Array, vol. 17, No. 10, Oct. 1999, pp. 974–978.

Devitt, Terry, "Advanced May Put Gene Chip Technology on Scientists Desktops", http://www.biotech.wise.edu/Education/biotechnews/GeneChip.html, Oct. 7, 1999.

Sandstrom and Odselias, "Large–Area High Quality Photomasks", Micronic Laser Systems, published by SPIE vol. 2621, pp. 312–318.

*Primary Examiner*—Russell Adams
*Assistant Examiner*—Khaled Brown
(74) *Attorney, Agent, or Firm*—Haynes & Boone, LLP

(57) ABSTRACT

Disclosed is a method, system, and lense system for performing lithography on a substrate. The system includes a unique lense system for nonplanar substrates. The lense system includes a first lense section for receiving a pattern and producing a concave image of the pattern. The concave image can the be received by a second lense section for producing a nonplanar image of the pattern. The system also includes two light sources and a digital imaging device for projecting and exposing the pattern through the lense section and onto the substrate. Light from the first light source is used for exposing the pattern while light from second light source is used for receiving an alignment image. An image sensor, using the light from the second light source, detects an alignment image from the substrate. The alignment image is used to accommodate the projection of the pattern onto the substrate so that the pattern is properly aligned to the substrate.

14 Claims, 9 Drawing Sheets

U.S. PATENT DOCUMENTS

| | | | | |
|---|---|---|---|---|
| 5,132,723 A | | 7/1992 | Gelbart | 355/40 |
| 5,138,368 A | | 8/1992 | Kahn et al. | 355/53 |
| 5,208,818 A | | 5/1993 | Gelbart et al. | 372/30 |
| 5,269,882 A | | 12/1993 | Jacobsen | 156/659.1 |
| 5,281,996 A | | 1/1994 | Bruning et al. | 355/77 |
| 5,300,966 A | | 4/1994 | Uehira et al. | 353/30 |
| 5,361,272 A | | 11/1994 | Gorelik | 372/50 |
| 5,416,729 A | | 5/1995 | Leon et al. | 364/578 |
| 5,431,127 A | | 7/1995 | Stevens et al. | 117/75 |
| 5,461,455 A | | 10/1995 | Coteus et al. | 355/43 |
| 5,661,548 A | * | 8/1997 | Imai | |
| 5,691,541 A | | 11/1997 | Ceglio et al. | 250/492.1 |
| 5,777,722 A | * | 7/1998 | Miyazaki et al. | |
| 5,793,473 A | | 8/1998 | Koyama et al. | 355/55 |
| 5,801,813 A | | 9/1998 | Morimoto et al. | 355/27 |
| 5,812,242 A | | 9/1998 | Tokuda | 355/30 |
| 5,818,498 A | | 10/1998 | Richardson et al. | 347/237 |
| 5,866,281 A | | 2/1999 | Guckel et al. | 430/22 |
| 5,870,176 A | | 2/1999 | Sweatt et al. | 355/53 |
| 5,877,843 A | | 3/1999 | Takagi et al. | 355/30 |
| 5,879,843 A | | 3/1999 | Ueno | 430/22 |
| 5,892,231 A | | 4/1999 | Baylor et al. | 250/398 |
| 5,900,637 A | | 5/1999 | Smith | 250/492.22 |
| 5,905,545 A | | 5/1999 | Poradish et al. | 348/743 |
| 5,909,658 A | | 6/1999 | Clarke et al. | 702/126 |
| 5,949,557 A | | 9/1999 | Powell | 359/8 |
| 5,955,776 A | | 9/1999 | Ishikawa | 257/618 |
| 5,995,129 A | | 11/1999 | Sunagawa et al. | 347/239 |
| 5,995,475 A | | 11/1999 | Gelbart | 369/112 |
| 5,998,069 A | | 12/1999 | Cutter et al. | 430/5 |
| 6,014,203 A | | 1/2000 | Ohkawa | 355/68 |
| 6,042,976 A | | 3/2000 | Chiang et al. | 430/22 |
| 6,048,011 A | | 4/2000 | Fruhling et al. | 294/64.3 |
| 6,052,517 A | | 4/2000 | Matsunaga et al. | 395/500.09 |
| 6,061,118 A | * | 5/2000 | Takada | |
| 6,071,315 A | | 6/2000 | Ramamurthi et al. | 716/19 |
| 6,072,518 A | | 6/2000 | Gelbart | 347/239 |
| 6,084,656 A | | 7/2000 | Choi et al. | 355/71 |
| 6,107,011 A | | 8/2000 | Gelbart | 430/397 |
| 6,124,876 A | | 9/2000 | Sunagawa | 347/239 |
| 6,133,986 A | | 10/2000 | Johnson | 355/67 |
| 6,205,364 B1 | | 3/2001 | Lichtenstein et al. | 700/58 |
| 6,236,448 B1 | * | 5/2001 | Ota | |
| 6,251,550 B1 | | 6/2001 | Ishikawa | 430/22 |
| 6,195,154 B1 | * | 2/2002 | Imai | |

\* cited by examiner

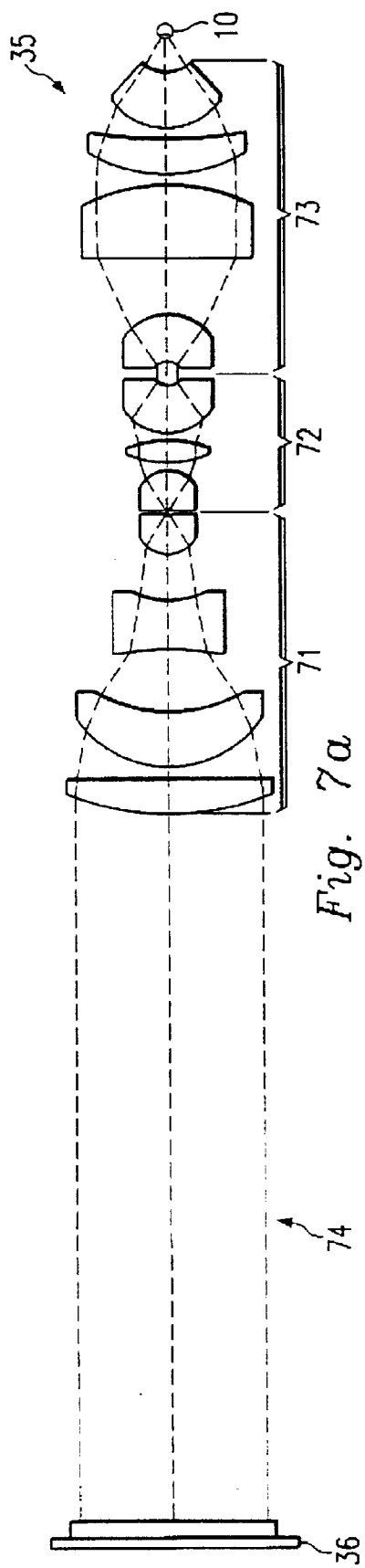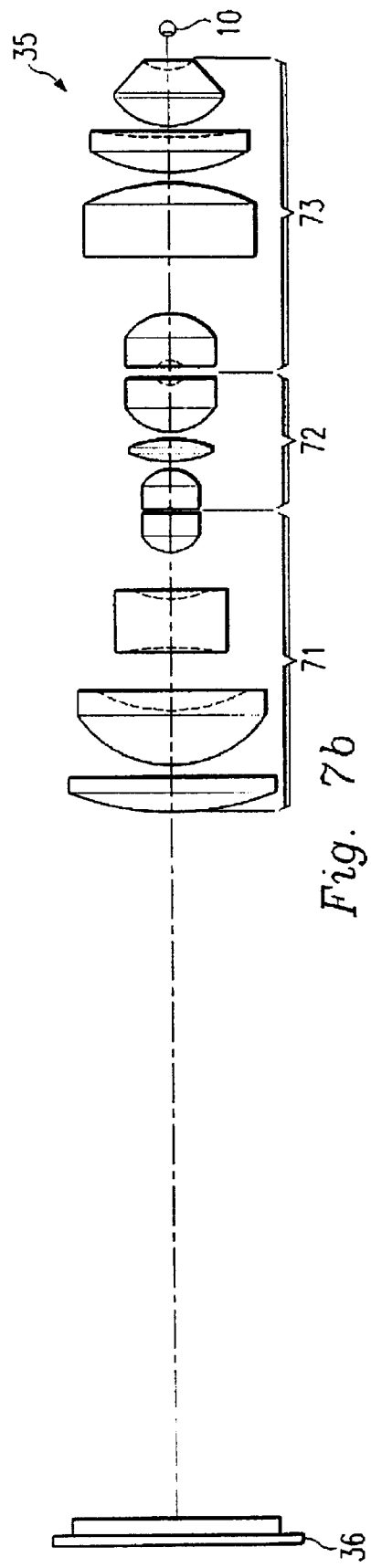

SYSTEM AND METHOD FOR PERFORMING LITHOGRAPHY ON A SUBSTRATE

This patent claims the benefit of U.S. Ser. No. 60/129,315, which was filed Apr. 14, 1999.

BACKGROUND OF THE INVENTION

The invention relates generally to photo lithography, and more particularly, to a system for performing lithography on two and three dimensional substrates such as a spherical shaped substrate.

Conventional integrated circuits, or "chips," are formed from two dimensional or flat surface semiconductor wafers. The semiconductor wafer is first manufactured in a semiconductor material manufacturing facility and is then provided to a fabrication facility. At the latter facility, several layers are processed onto the semiconductor wafer surface using various design concepts, such as VLSI design. Although the processed chip includes several layers fabricated thereon, the chip still remains relatively flat.

U.S. Pat. No. 5,955,776, which is hereby incorporated by reference, describes a three dimensional, spherical-shaped substrate for receiving various circuits. Of the many process disclosed in the above-referenced application, several are related to imaging a circuit design onto the three dimensional substrate. Often, the circuit design to be imaged may be two dimensional in nature.

There are numerous problems associated with imaging a two-dimensional circuit design onto a three-dimensional substrate, such as a spherical shaped substrate. For example, converting two-dimensional computer aided designs (CAD) of a circuit into a mask for projecting onto a three-dimensional surface requires separation of the circuit into unit segments that can be positioned on the mask and then projected onto the device. Thus, when designing two-dimensional integrated circuits (IC) using CAD tools, there must be a way to segment the design into sections that can be positioned on a mask and projected onto a three-dimensional surface. Also, it is very difficult to expose all surfaces of a three-dimensional substrate.

One partial solution is shown in U.S. Pat. Ser. No. 09/351,203. This application teaches a system for designing a flat mask to be imaged onto a spherical substrate. The system uses a mask and several angled mirrors for reflecting a pattern from the mask onto various portions of the substrate. However, this solution has poor light efficiency due to the mask and the angled mirrors.

Another partial solution is shown in U.S. Pat. No. 5,691,541. This patent teaches a maskless, reticle-free lithography system. However, this solution is for static systems, limited to two-dimensional substrates, and does not dynamically provide fine pattern alignment.

These and other conventional solutions do not provide the accuracy and light intensity often required for performing lithography on a three dimensional substrate. Therefore, what is still needed is a system and method for projecting a two-dimensional circuit design onto a three dimensional substrate.

SUMMARY

A technological advance is achieved by a method, system, and lense system for performing lithography on a substrate. In one embodiment, the method captures the substrate and divides it into a number of regions. The substrate is first rough-aligned, and then a fine-alignment offset is determined. A pattern is then projected onto a first region of the substrate, adjusted by the first fine-alignment offset.

In some embodiments, the method then re-captures the substrate and fine-aligns a second pattern. The second pattern is then projected onto a second region of the substrate.

In some embodiments, the fine-alignment is performed by receiving an image of the roughly aligned substrate and comparing a predetermined mark on the image with the first pattern. This comparison can thereby determine the fine-alignment offset.

In some embodiments, the pattern is digitally stored in a computer memory device so that fine-aligning can be accomplished by moving the pattern in memory.

In one embodiment, the system for performing lithography on a substrate includes a lense section having one or more lenses, two light sources, and a device for projecting and exposing the pattern through the lense section and onto the substrate. Light from the first light source is used for exposing the pattern while light from second light source is used for providing an alignment image. An image sensor receives the alignment image from the substrate and uses it to properly align the pattern to the substrate.

In some embodiments, the system includes a beam splitter for separately directing the first and second lights. The beam splitter can separately direct the second light coming from the second light source and the alignment image coming from the substrate.

In another embodiment, the system utilizes a single source of light. A device such as a digital imaging device converts the light into a pattern, projects the pattern through the lense section, and exposes the pattern onto the substrate. A beam splitter is positioned between the digital imaging device and the substrate for separately directing an image of the substrate to an image sensor. As a result, the substrate image is used to accommodate the projection of the pattern onto the substrate so that the pattern is properly aligned to the substrate.

In some embodiments, the system includes a computer for receiving the alignment image from the image sensor and modifying the pattern used by the device to align the pattern with the substrate. The pattern may be digital so that the computer modifies the digital pattern by moving the pattern in memory.

In some embodiments, the system utilizes a reservoir for containing a transparent fluid through which the light may travel before reaching the substrate. One or more lenses of the lense section may be located in the reservoir of transparent fluid and/or may be part of the reservoir. In addition, a second reservoir may be used to contain the substrate.

In some embodiments, the system may use multiple lense sections and light sources. These embodiments may simultaneously expose different regions of the substrate, or may sequentially expose the substrate after it moves from one holder to another.

In one embodiment, a unique lense system can be used for nonplanar substrates. The lense system includes a first lense section for receiving a pattern and producing a concave image of the pattern. The concave image can then be received by a second lense section for producing a nonplanar image of the pattern. The nonplanar image coincides with the nonplanar substrate.

BRIEF DESCRIPTION OF THE DRAWINGS

FIGS. 7a–7b are drawings of an improved lense system according to one embodiment of the present invention.

DESCRIPTION OF THE EMBODIMENTS

The present invention provides a system and method for performing lithography on different shaped substrates. It is understood that the following disclosure provides many different embodiments, or examples, for implementing different features of this invention. Specific examples of lenses, components, substrates, and system configurations are described below to simplify the present disclosure. These are, of course, merely examples and are not intended to limit the invention from that described in the claims.

The following disclosure is separated, for the sake of clarity, into three discussions: 1) an exemplary substrate; 2) an exemplary method; and 3) exemplary systems. Each of the discussions focuses on one or more components for implementing different embodiments of the invention. To further simplify the following disclosure, many examples are continued through each of the discussions.

1. An Exemplary Substrate

Figure 1:
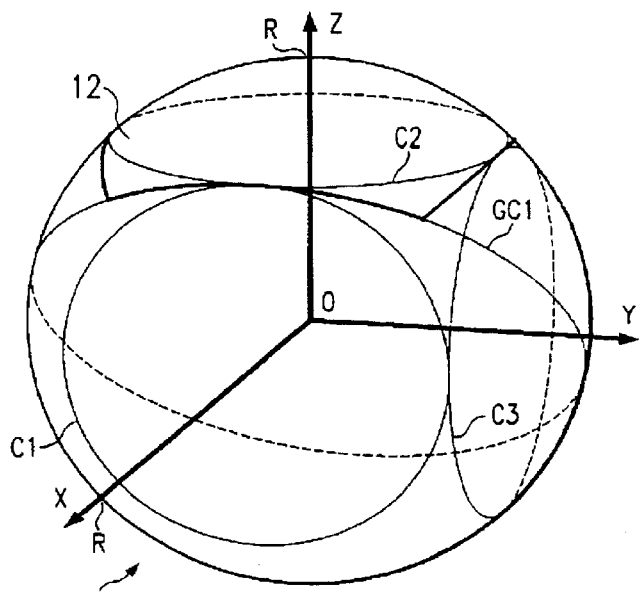
FIG. 1 is a three dimensional illustration of a substrate for receiving a photolithography operation.

Referring now to FIG. 1, the reference numeral 10 refers, in general, to a three dimensional substrate on which an image or pattern will be imposed. For the sake of example, the substrate 10 may be a spherical shaped semiconductor device according to presently incorporated U.S. Pat. No. 5,955,776, although other two and three dimensional devices will also benefit from the present invention. In the present embodiment, it is desired to perform lithographic operations on an outer surface 12 of the sphere.

The sphere 10 has a radius "R" from a center point "O". The surface 12 is divided into six circles, three of which (circles C1, C2, C3) are illustrated. Each of the circles intersects four other circles at exactly one point per circle. For example, circle C1 intersects the circle C2 at a point P12, and intersects the circle C3 at a point P13. In the present example, the center point O is located at the origin of an X,Y,Z axis, and the circle C1 radially extends around the X axis.

In addition, six great circles can be drawn on the surface 12. Each great circle connects two opposite intersection points. A great circle GC1 is illustrated, and passes through the point P12 and an opposite point (not shown).

Figure 2:
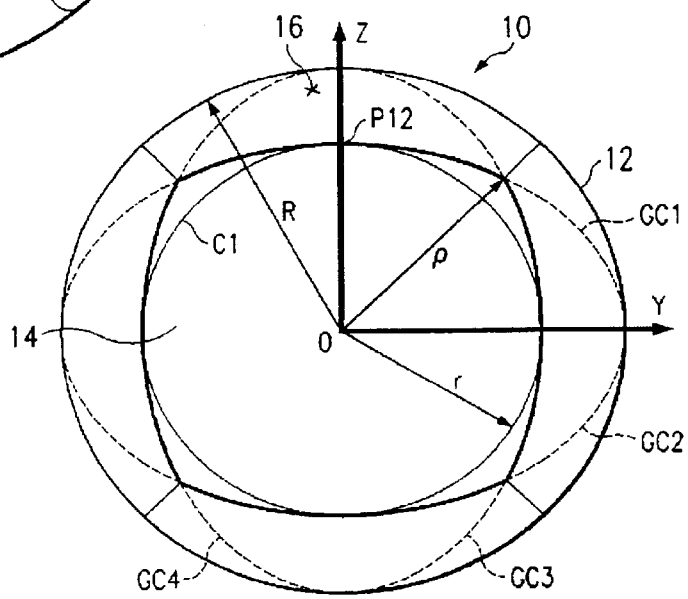
FIG. 2 is a two dimensional illustration of the substrate of FIG. 1.

Referring also to FIG. 2, a two-dimensional representation of the sphere 10 is viewed along the X axis of FIG. 1. The circle C1 is centered in this representation, and four great circles GC1, GC2, GC3, GC4 that intersect the circle C1 are illustrated. The smallest area defined by the intersection of the four great circles GC1, GC2, GC3, GC4 represents a region 14. It can be readily determined that six different regions are now defined, each identical in size and shape with the region 14. The six regions completely cover the surface 12. It is understood that in other embodiments, the regions may not completely cover the surface.

In the present embodiment, the six regions are not physically inscribed on the surface 12, but instead represent system-designated regions to be discussed below. The surface 12 may includes one or more physical alignment marks, such as an alignment mark 16, to locate and align the six regions. In some embodiments, the alignment mark 16 can be arbitrarily made on the surface 12 during a first etching process. From then on, all other lithographic and etching processes can align to the mark 16, thereby designating the six regions.

2. An Exemplary Method

Figure 3:
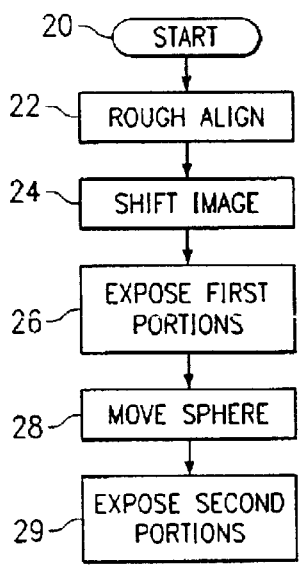
FIG. 3 is a flow chart for one embodiment of a method for performing lithography on a substrate such as the substrate of FIG. 1.

Referring to FIG. 3, a method 20 may be used to perform a lithographic operation on the sphere 10. At step 22, a rough alignment procedure positions the sphere 10 so that the alignment mark 16 is near a predetermined location. The rough alignment can be done in many different ways, such as using a camera (not shown) to identify the mark 16 and using a holding device to capture the sphere 10.

At step 24, a fine alignment procedure is performed. The fine alignment procedure can operate in various ways. For one, the sphere 10 and/or a pattern source can be physically moved in small increments until the two are aligned. In a maskless lithography system as described below, the pattern can be electrically altered to align with the sphere 10.

At step 26, several regions (e.g., region 14) of the sphere 10 are exposed with an appropriate pattern. At step 28 the sphere is moved so that at step 29, the remaining regions of the sphere 10 can be exposed. As a result, all of the regions receive an appropriate pattern and the entire outer surface 12 of the sphere 10 is exposed. It is understood, however, that in some embodiments, only portions of the outer surface need to be exposed. In these latter embodiments, step 26 discussed above may be sufficient to expose all the desired portions.

3. Exemplary Systems

Figure 4:
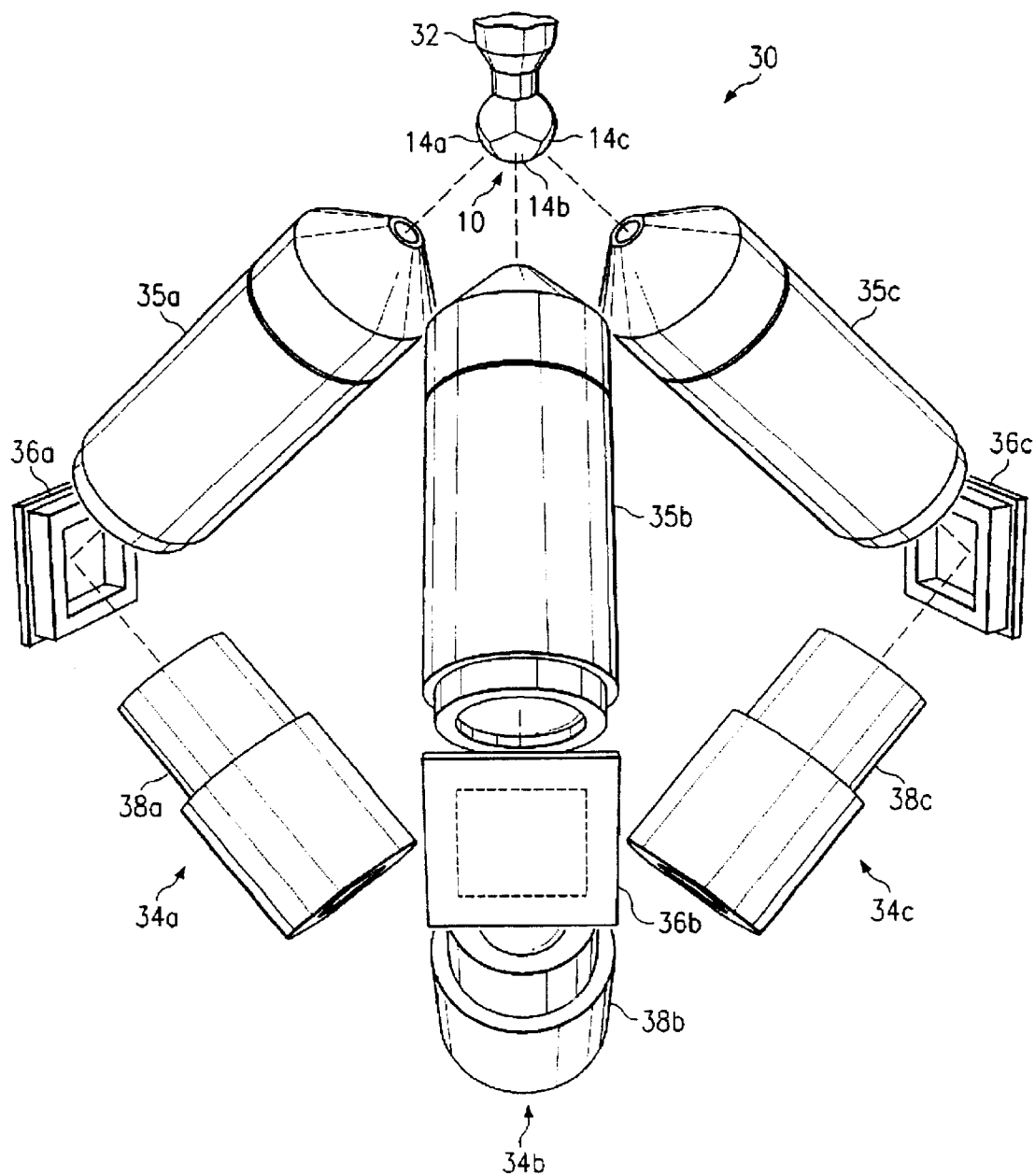
FIGS. 4 and 5 are side views of a system for performing photolithography according to the method of FIG. 3.

Referring now to FIG. 4, one or more steps of the method 20 (FIG. 3) can be performed by a photolithography system 30. The system 30 includes a holding device 32 for securing the sphere 10 in a predetermined position. For the sake of example, one type of holding device is a positive pressure catcher as disclosed in U.S. Ser. No. 09/162,616, which is hereby incorporated by reference. The catcher 32 may be able to position the sphere 10 as required in step 22 of FIG. 3 so that the alignment mark 16 (not shown) is near a predetermined location.

Located proximate to the sphere 10 are three imaging systems 34a, 34b, 34c. The imaging systems are each directed to three different regions of the sphere 10. For the sake of example, the imaging systems 34a, 34b, 34c are directed towards regions 14a, 14b, 14c, respectively. In the present embodiment, each of the regions 14a, 14b, 14c are similar to the region 14 of FIG. 2.

The imaging systems 34a, 34b, 34c include three lense systems 35a, 35b, 35c, which are visually aligned with three digital light processing ("DLP") mirror devices 36a, 36b, 36c, respectively, such as is produced by Texas Instruments of Dallas, TX. Three projection systems 38a, 38b, 38c are also aligned with the three mirror devices 36a, 36b, 36c, respectively. In another embodiment, a light emitting diode ("LED") display can be used instead of the mirror devices. The use of LED displays and mirror devices for photolithographic operations is discussed in greater detail in U.S. Pat. Ser. No. 09/348,369, which is herein incorporated by reference.

By using the LED displays or mirror devices, the fine alignment step 24 (FIG. 2) can thereby be accomplished through digital adjustment. That is, the pattern in the mirror devices 36 can be adjusted to compensate for the rough alignment of step 22, thereby securing a fine alignment. Discussed in greater detail below, the adjustment can be made, for example, by aligning to the alignment mark 16 on the sphere 10.

Once aligned, light can be projected from the three projection systems 38a, 38b, 38c, onto the three mirror devices 36a, 36b, 36c, respectively, which thereby produce three separate patterns (one each). The three patterns are then projected through each of the lense systems 35a, 35b, 35c to expose the patterns on the regions 14a, 14b, 14c, respectively. The imaging systems 34a, 34b, 34c adjust the patterns so that they are finely focused and aligned to their respective region.

Figure 5:
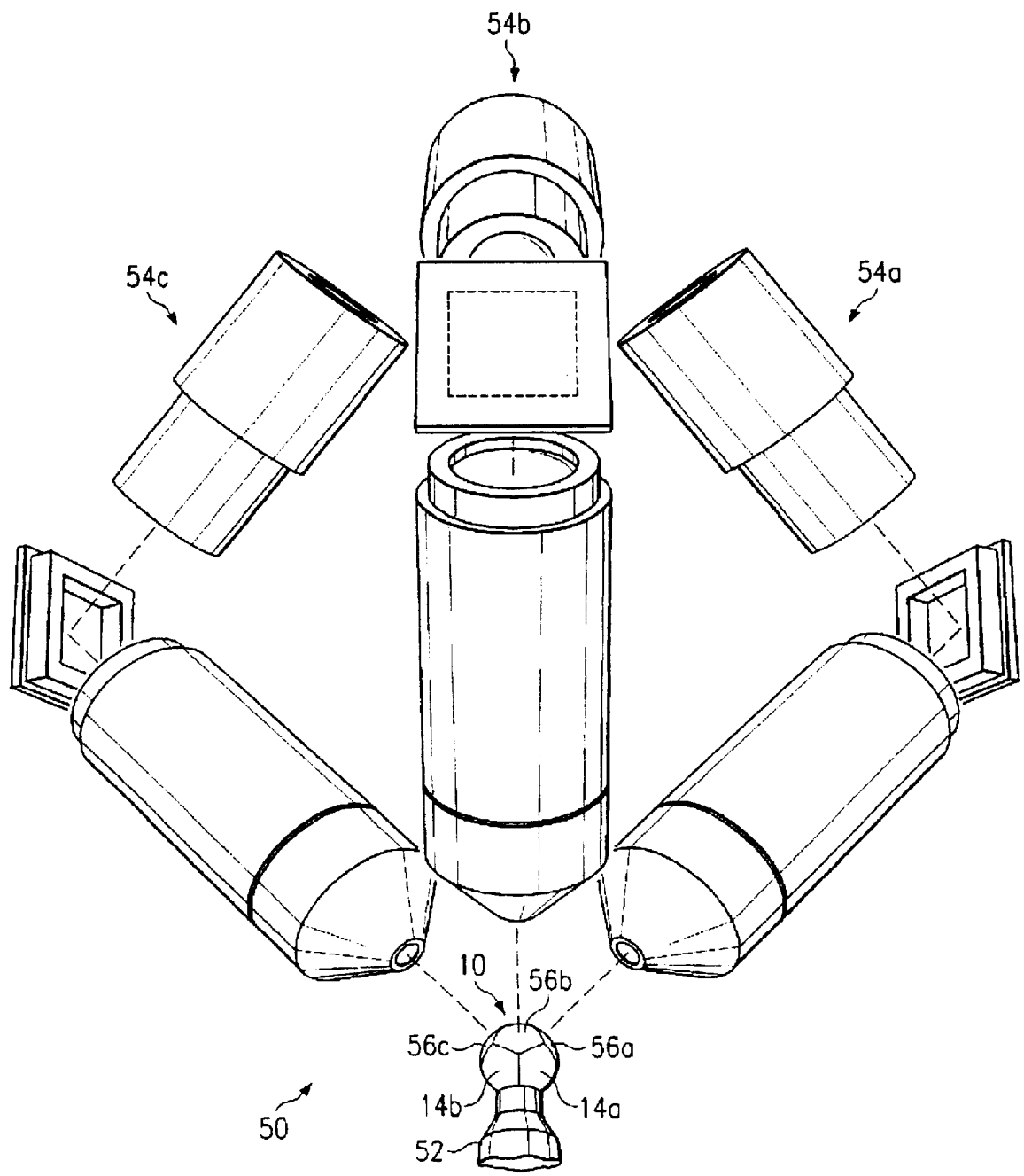

Once the first three patterns have been exposed on the sphere 10, the sphere may move to a new position. Referring simultaneously to FIGS. 4 and 5, for the sake of example, the sphere 10 drops, as shown in FIG. 4, to be received by a second catcher 50 in FIG. 5. The alignment of the sphere 10 in FIG. 5 is almost exactly the same as it was in FIG. 4, so the rough alignment procedure may be skipped, in some embodiments.

Referring specifically to FIG. 5, the photolithography system 30 includes three additional imaging systems 54a, 54b, 54c to project and expose the second group of patterns onto regions 56a, 56b, 56c, respectively. The same configurations and procedures described above with reference to FIG. 4 can be used with respect to FIG. 5.

Figure 6:
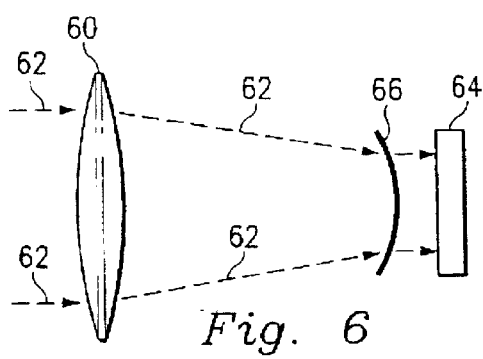
FIG. 6 is a schematic drawing of a conventional lense system.

Referring now to FIG. 6, a prior art lense 60 can be used to focus a pattern of light rays 62 towards a flat substrate 64, such as a semiconductor wafer. However, such a lense actually distorts the pattern as it appears on the substrate 64. In actuality, the pattern produced focuses into a concave image, as described by intermediate image 66.

Since the sphere 10 has a convex surface 12, the distortion from the prior art lense 60 would even be more prevalent. Therefore, it is desired to reduce this distortion as much as possible.

Referring to FIGS. 7a, 7b, 7c, and 7d, some embodiments of the present invention use a unique lense system that focuses the pattern to coincide with the substrate. In one embodiment, the lense system 35 (FIG. 4) can be logically divided into three separate sections 71, 72, 73. As is shown in the figure, the lense system 35 is located very close to the sphere 10, as compared to its proximity to the mirror device 36.

Figure 7C:
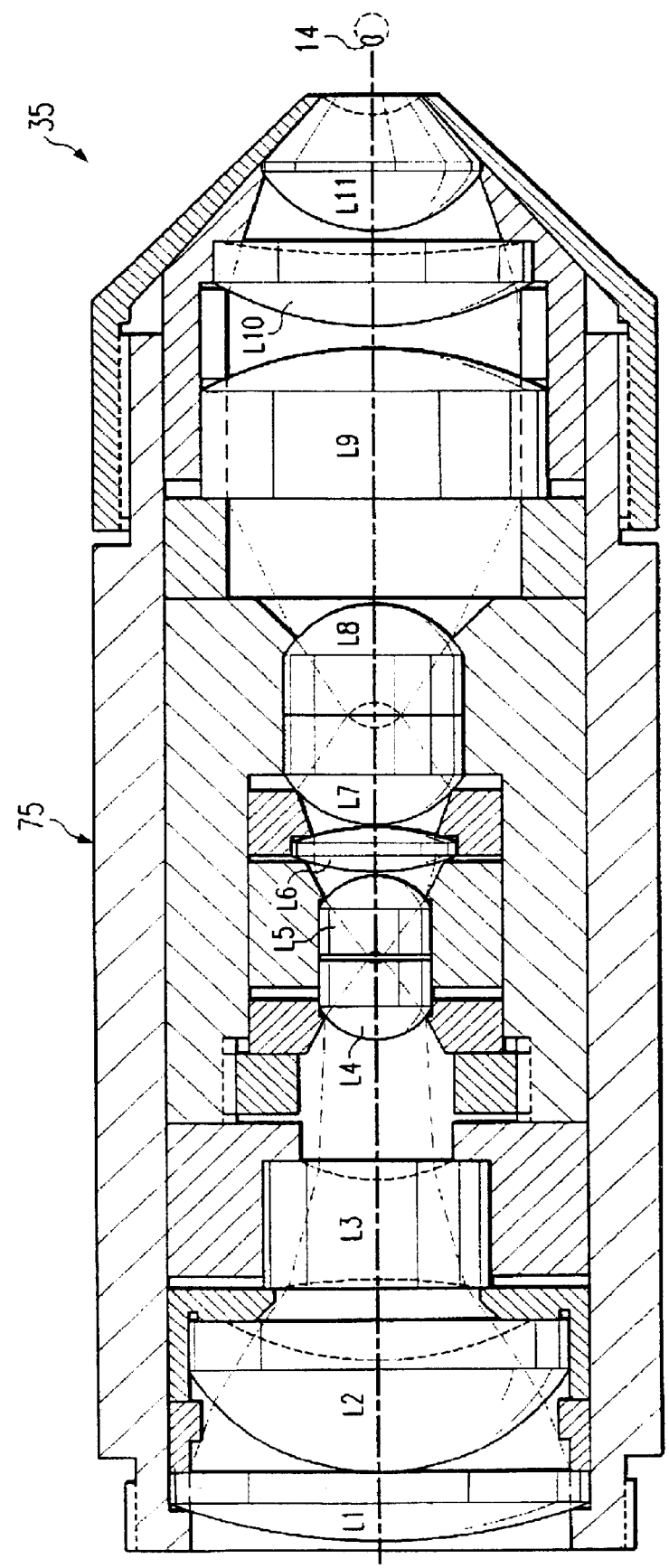
FIGS. 7c–7d are drawings of different physical implementations of the lense system of FIGS. 7a–7b.

FIG. 7a also shows a plurality of light rays 74 that are ray traced from the mirror device 36 to the substrate 10. FIG. 7b shows the same sections 71, 72, 73 of lenses, without the light rays 74 being illustrated, in order to clarify the lense layout for each section. FIG. 7c shows the same sections 71, 72, 73 of lenses, configured in a mechanical fixture 74 for typical production operations.

Figure 7D:
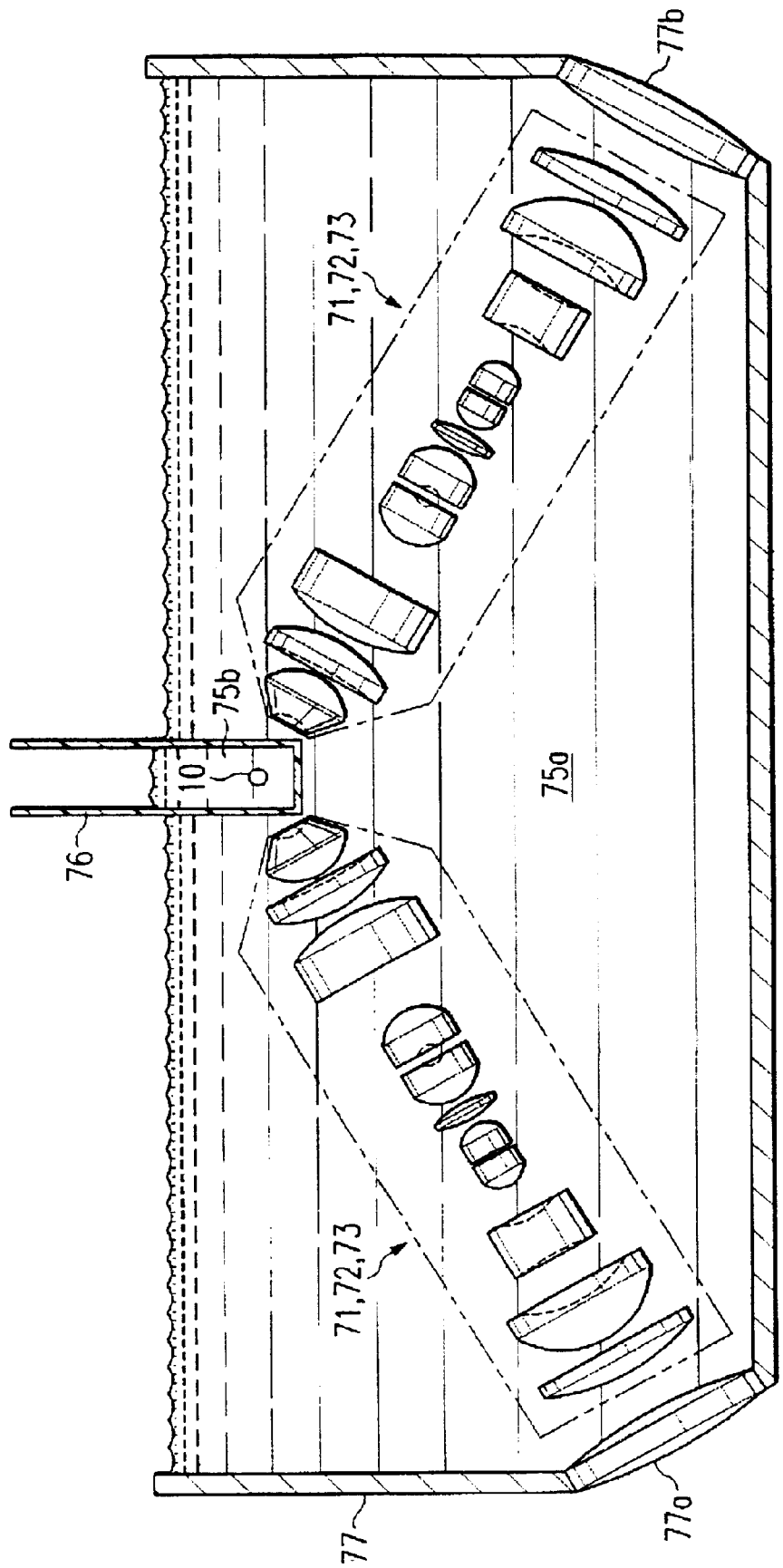

FIG. 7d shows an alternate embodiment where the lenses 71–73 and/or the sphere 10 are suspended in a transparent liquid 75a. In this embodiment, the catchers 38 an 50 are not needed during exposure. Instead, the sphere 10 can be placed in a transparent container 76, which also includes a transparent liquid 75b. The transparency of the container 76 and the liquids 75 is specifically chosen to accommodate the optical affects for the lithographic operation. In addition, the liquid 75a may be contained in a reservoir 77 having a plurality of transparent portions 77a, 77b, as needed. In some embodiments, the transparent portions may actually be one of the individual lenses from lense groups 71–73. By having some or all of the lenses 71–73 and/or the sphere 10 suspended in liquid, the effects of movement and vibration are significantly reduced.

Referring to FIGS. 7a–7d together, the first section 71 provides a first group of lenses L1, L2, L3, L4; the second section 72 provides a second group of lenses L5, L6, L7; and the third section 73 provides a third group lenses L8, L9, L10, L11. The first section 71 produces a concave-inverted image of the pattern to be exposed, similar to the intermediate image 66 of FIG. 6. The second section 72 receives the concave-inverted image from the first section 71 and produces a convex-inverted image that is formed from relatively-parallel light rays. The third section 73 receives the convex-inverted image from the second section 72 and projects the pattern onto the surface of the sphere 10. Although the third section 73 tries to distort the image of the pattern in a concave manner, the final image on the sphere 10 is still slightly convex.

As a result, since the surface 12 of the sphere 10 is also slightly convex, very little distortion, if any, appears on the sphere. The lenses 71–73 are also chosen to accommodate a spherical shaped substrate. If the substrate is of another shape (e.g., oblong or angular), then different shaped lenses can be used to coincide with the surfaces of the substrate. It is noted that the lense system 35 only has a few constituent lens elements, a large numerical aperture, and an excellent spherical image surface across an entire field of view.

Figure 8A:
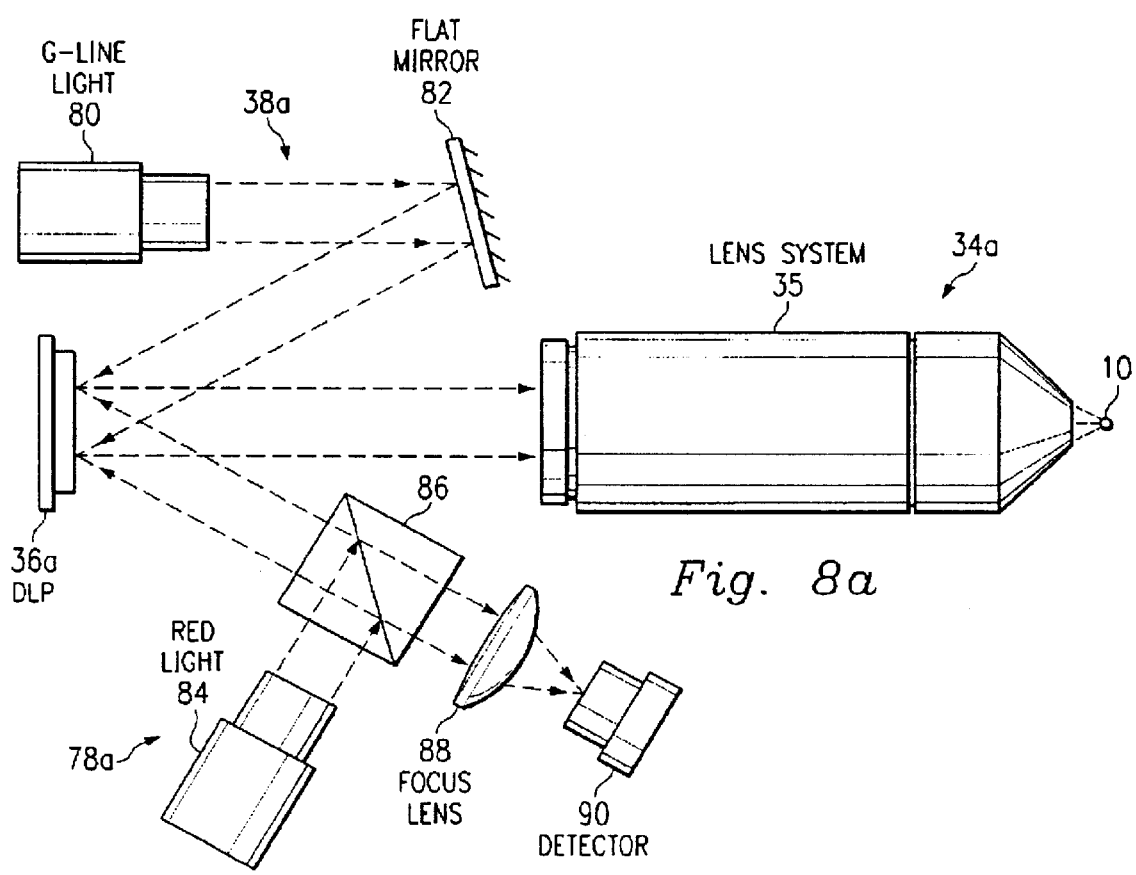
FIGS. 8a–8b are schematic diagrams of imaging systems for performing lithography according to the method of FIG. 3.

Referring now to FIG. 8a, in one embodiment, each of the six imaging systems 34a, 34b, 34c (FIG. 4) and 54a, 54b, 54c (FIG. 5) are similarly constructed. For the sake of simplicity, only the imaging system 34a will be discussed in greater detail.

The imaging system 34a includes the projection systems 38a and an alignment system 78a. The projection system 38a includes a G-line light source 80 that projects light off a flat, stationary mirror 82 and towards the mirror device 36. The mirror device 36 is operable to selectively direct the G-line light through the lense system 35a and onto the sphere 10. The G-line light is of a type that, when exposed on photoresist (on the substrate 10), causes the photoresist to develop.

Before the imaging system 34a exposes the pattern onto the sphere 10, however, the alignment system 78a is used to align the pattern with the sphere. The alignment system 78a includes a red light source 84, a beam splitter 86, a lense system 88, and a detector 90. The red light source 84 projects a red light through the beam splitter 86 and towards the mirror device 36. The mirror device 36 is operable to selectively direct the red light through the lense system 35a and onto the sphere 10. The red light does not affect photo resist, so that it can be projected onto the sphere 10 without any permanent affects.

The mirror device 36 also directs a reflection of the red light back towards the beam splitter 86. The beam splitter 86 is designed to have the desired angular affect on the red-light so that the reflection is directed towards the lense system 88 and the detector 90. This reflection can be used as an alignment image by the detector 90, so that fine alignment procedures can be performed, as discussed below.

Figure 8B:
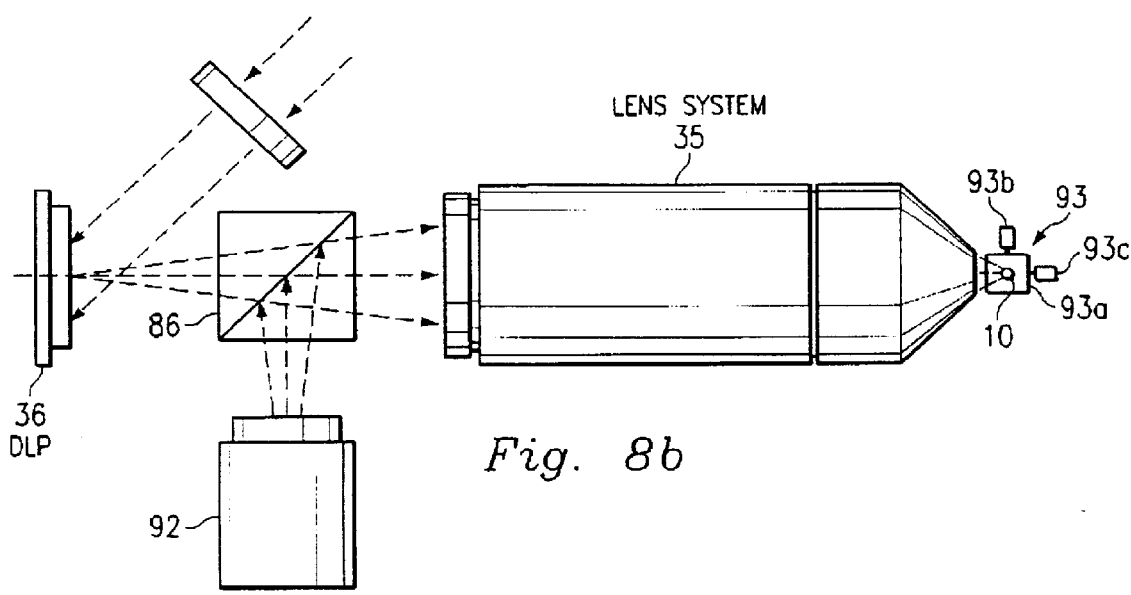

Referring now to FIG. 8*b*, in another embodiment, the beam splitter 86 can be positioned directly between the mirror device 36 and the lense system 35. In this embodiment, a portion of the light is directed toward the sphere 10, while the remaining portion is directed towards the detector 90.

Also in this embodiment, a CCD camera 92 is used as the detector for image alignment. In addition, a moveable staging system 93 is used to position the sphere 10. The system 93 includes a mechanical stage 93*a* that is rotatable about two axis by two motors 93*b*, 93*c*. This embodiment supports immediate and continual alignment of the pattern on the mirror device 36 with the sphere 10.

Figure 9:
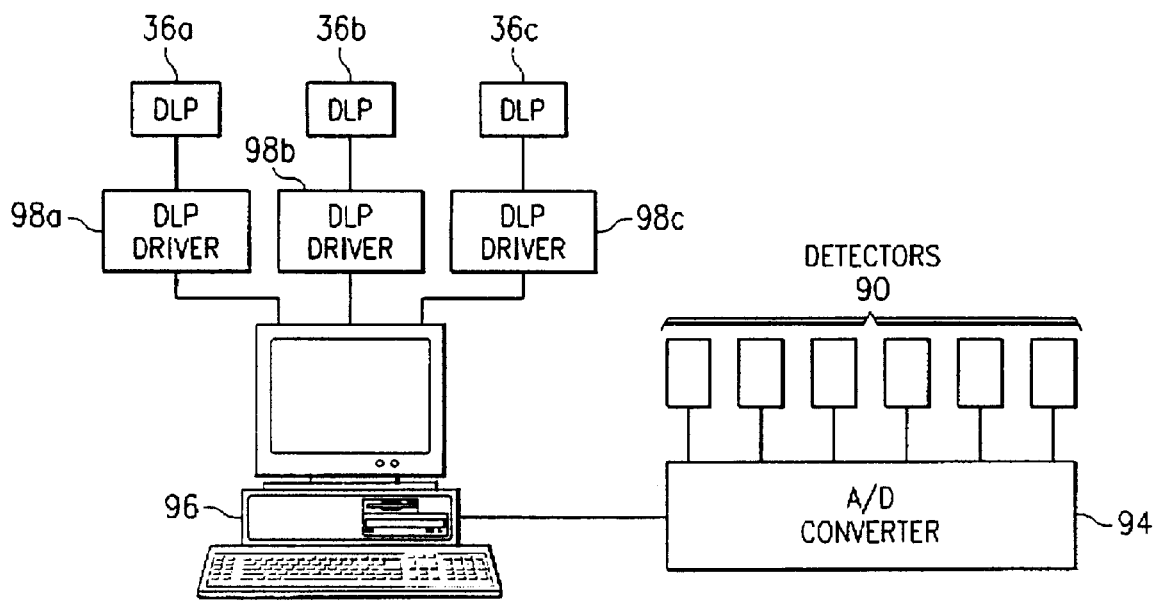
FIGS. 9 and 11 are schematic diagrams of a computer system for facilitating the imaging systems of FIGS. 8a–8b.

Referring now to FIG. 9, in some embodiments, the detector 90 is one of six detectors, one for each of the six imaging systems 34*a*, 34*b*, 34*c* (FIG. 4) and 54*a*, 54*b*, 54*c* (FIG. 5). However, only three mirror devices 36*a*, 36*b*, 36*c* are used, being shared between the operation discussed in FIG. 4 and the operation discussed in FIG. 5. The detectors 90 are connected to an image converter 94, which is further connected to a computer 96. Likewise, the mirror devices 36*a*, 36*b*, 36*c*, are connected to drivers 98*a*, 98*b*, 98*c*, respectively, which are further connected to the computer 96.

Figure 10A:
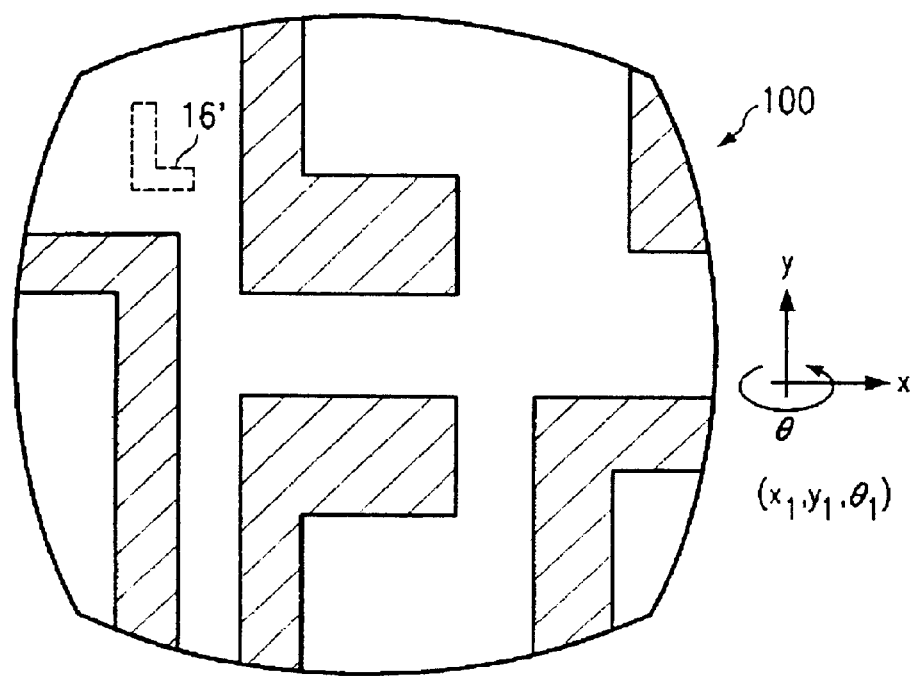
FIG. 10 includes illustrations of a pattern and alignment image used by the computer systems of FIGS. 9 and 11.
Figure 10B:
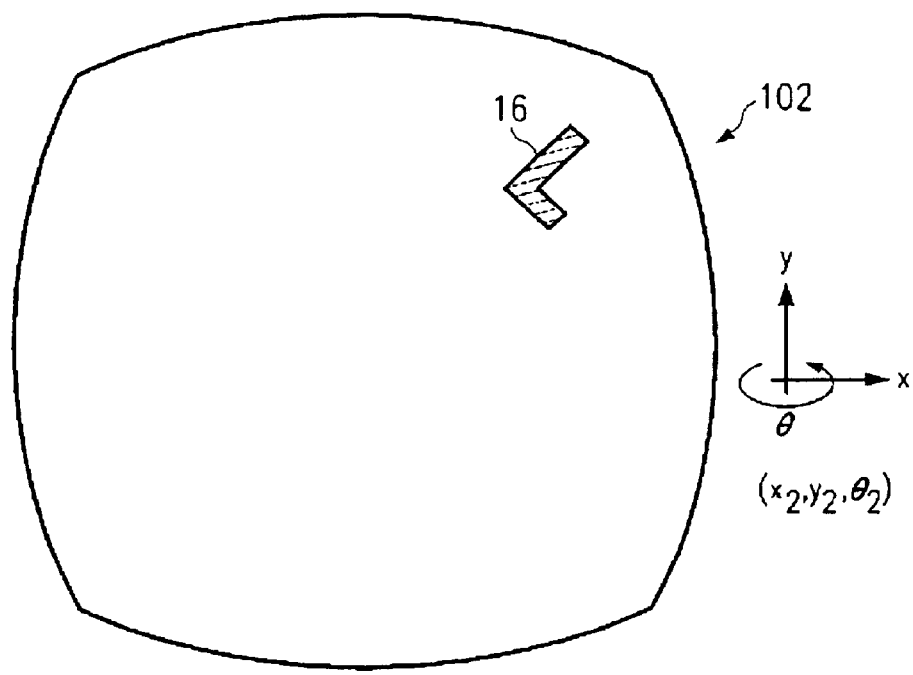

Referring to FIG. 10, in the present embodiment, the computer 96 includes memory for storing a pattern 100 to be projected onto the sphere 10. The pattern 100 may include an item 16' for aligning to the sphere 10. The computer 96 receives an alignment image 102 from one or more the detectors 90. The alignment image 102 may include the alignment mark 16 (FIG. 2). The computer compares the desired location of the item 16'(e.g., $X_1$, $Y_1$, $\Theta_1$) with the location of the alignment mark 16 (e.g., $X_2$, $Y_2$, $\Theta_2$) to determine an alignment offset (e.g., $X_1-X_2$, $Y_1-Y_2$, $\Theta_1-\Theta_2$). The computer then "moves" the pattern 100 stored in memory to accommodate the difference between the alignment images and the expected alignment. This movement can be accomplished by changing an address space for the pattern 100 stored in memory. The moved pattern 100 is then provided to the mirror devices 36*a*, 36*b*, 36*c* through the drivers 98*a*, 98*b*, 98*c*, respectively. As a result, the aligned patterns can be exposed onto the sphere 10.

Figure 11:
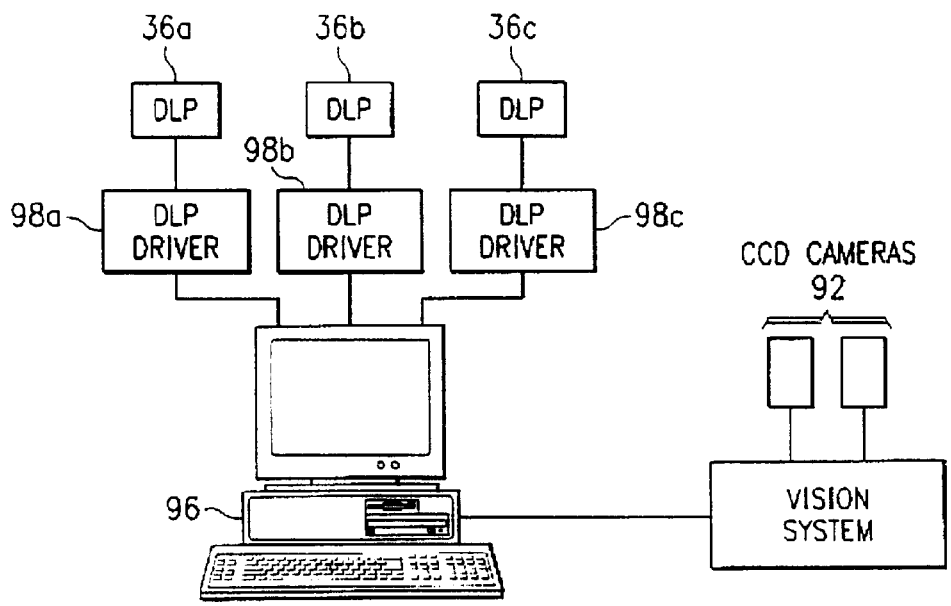

Referring now to FIG. 11, instead of detectors, one or more CCD cameras 104*a*, 104*b* are used to receive the alignment image from the sphere 10. The CCD camera 104*a* simultaneously catches all the alignment images for the first group of regions being exposed (e.g., regions 14*a*, 14*b*, 14*c* of FIG. 4). Likewise, the CCD camera 104*b* simultaneously catches all the alignment images for the second group of regions being exposed (e.g., regions 56*a*, 56*b*, 56*c* of FIG. 5). The ability to simultaneously catch multiple images can be accomplished by simultaneously directing the alignment images from multiple alignment systems (e.g., alignment system 78*a* of FIG. 8*a*) towards a single camera.

Referring again to FIG. 10, once the alignment images from the CCD cameras 104*a*, 104*b* are captured, they are combined into the alignment image 102 and the pattern 100 is aligned as discussed above.

Although illustrative embodiments of the invention have been shown and described, other modifications, changes, and substitutions are intended in the foregoing disclosure. Accordingly, it is appropriate that the appended claims be construed broadly and in a manner consistent with the scope of the invention.

what is claimed is:

1. A system for performing lithography on a substantially spherical substrate having at least first and second portions to be exposed, wherein the first and second portions have differing orientations, the system comprising:
   a device for positioning the substantially spherical substrate so that one of the first or second portions can be exposed;
   a lense section having one or more lenses;
   a first light source for making a first light capable of exposing the substantially spherical substrate;
   a device for converting the first light into a first pattern, projecting the first pattern through the lense section, and exposing the first pattern onto the one of the first or second portions of the substantially spherical substrate;
   a second light source for making a second light, the second light not being capable of exposing the substantially spherical substrate; and
   an image sensor for using the second light to detect an alignment image from the substantially spherical substrate;
   whereby the alignment image is used to accommodate the projection of the first pattern onto the substantially spherical substrate so that the first pattern is properly aligned to the substantially spherical substrate.

2. The system of claim 1 wherein the first and second portions of the substantially spherical substrate are relatively flat.

3. The system of claim 1 further comprising:
   a computer for receiving the alignment image from the image sensor and modifying the pattern used by the device to align the pattern with the substantially spherical substrate.

4. The system of claim 3 wherein the pattern is digital, the device is a digital imaging device for displaying digital patterns, and the computer includes memory for storing the digital pattern.

5. The system of claim 4 wherein the computer modifies the digital pattern by moving the pattern in memory.

6. The system of claim 1 further comprising:
   a beam splitter for separately directing the first and second lights.

7. The system of claim 1 further comprising:
   a reservoir for containing a transparent fluid through which the first and second light travel before reaching the substantially spherical substrate.

8. The system of claim 7 wherein at least one lense of the lense section is located in the reservoir of transparent fluid.

9. The system of claim 8 wherein at least one lense of the lense section is part of the reservoir.

10. The system of claim 1 further comprising:
    a first reservoir for containing a first transparent fluid and at least one lense of the lense section; and
    a second reservoir for containing a second transparent fluid and the substantially spherical substrate.

11. The system of claim 1 further comprising:
    a second lense section having one or more lenses;
    a third light source for making a third light; and
    a second device for converting the third light into a second pattern, projecting the second pattern through the second lense section, and exposing the second pattern onto the substantially spherical substrate;

whereby the first and second patterns are simultaneously exposed onto different regions of the substantially spherical substrate.

12. The system of claim 1 further comprising:

a first apparatus for holding the substantially spherical substrate while the first pattern is projected onto a first region of the substantially spherical substrate;

a second apparatus for receiving and holding the substantially spherical substrate after the first pattern is projected onto the substantially spherical substrate;

a second lense section having one or more lenses;

a third light source for making a third light; and a second device for converting the third light into a second pattern, projecting the second pattern through the second lense section, and exposing the second pattern onto the substantially spherical substrate;

whereby the second pattern is projected onto a second region of the substantially spherical substrate while being held by the second apparatus.

13. A system for performing lithography on a substantially spherical substrate having at least first and second portions to be exposed, wherein the first and second portions have differing orientations, the system comprising:

an apparatus for positioning the substantially spherical substrate so that at least one of the first or second portions can be exposed;

first and second lense sections having one or more lenses;

first and second light sources for making first and second lights;

first and second devices for converting the first and second lights into first and second patterns, projecting the first and second patterns through the first and second lense sections, respectively, and exposing the first and second patterns onto the first and second portions, respectively, of the substantially spherical substrate;

a beam splitter for separately directing a portion of at least one of the first and second lights to an image sensor; and the image sensor for detecting an alignment image from the substantially spherical substrate;

whereby the alignment image is used to accommodate the projection of the patterns onto the substantially spherical substrate so that the patterns are properly aligned with the substantially spherical substrate.

14. The system of claim 13 wherein the first and second patterns are digital, the devices are digital imaging devices for displaying digital patterns, and the system further comprises:

a computer for storing the digital patterns, receiving the alignment image from the image sensor, and modifying the stored digital patterns used by the digital imaging devices to align the patterns with the substantially spherical substrate.

* * * * *